United States Patent
Miyanari et al.

(10) Patent No.: US 9,962,915 B2
(45) Date of Patent: May 8, 2018

(54) BONDING METHOD AND BONDING APPARATUS

(71) Applicant: Tokyo Ohka Kogyo Co., Ltd., Kawasaki-shi (JP)

(72) Inventors: Atsushi Miyanari, Kawasaki (JP); Yoshihiro Inao, Kawasaki (JP); Shigeru Kato, Kawasaki (JP); Takahiro Setaka, Kawasaki (JP); Shingo Ishida, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 188 days.

(21) Appl. No.: 14/376,791

(22) PCT Filed: Jan. 23, 2013

(86) PCT No.: PCT/JP2013/051340
§ 371 (c)(1),
(2) Date: Aug. 5, 2014

(87) PCT Pub. No.: WO2013/118579
PCT Pub. Date: Aug. 15, 2013

(65) Prior Publication Data
US 2014/0374017 A1    Dec. 25, 2014

(30) Foreign Application Priority Data
Feb. 9, 2012    (JP) .................. 2012-026708

(51) Int. Cl.
*H01L 21/68*    (2006.01)
*B32B 37/10*    (2006.01)
(Continued)

(52) U.S. Cl.
CPC .............. *B32B 37/06* (2013.01); *B32B 37/04* (2013.01); *B32B 37/10* (2013.01);
(Continued)

(58) Field of Classification Search
CPC ..... H01L 2221/683; H01L 2221/68318; H01L 2221/68327; H01L 2221/68381;
(Continued)

(56) References Cited

U.S. PATENT DOCUMENTS

2002/0083849 A1    7/2002    Ohta et al.
2002/0127821 A1*   9/2002    Ohya .................. C09J 7/00
                                                                438/459
(Continued)

FOREIGN PATENT DOCUMENTS

JP    2002-192394    7/2002
JP    2007-109999    4/2007
(Continued)

OTHER PUBLICATIONS

International Search Report issued in PCT/JP2013/051340 dated Mar. 5, 2013.
(Continued)

*Primary Examiner* — Carson Gross
(74) *Attorney, Agent, or Firm* — Knobbe, Martens, Olson & Bear, LLP (57) ABSTRACT

A bonding method including an adhesive layer forming process in which a thermoplastic adhesive is applied to a substrate or a support plate and an adhesive layer is formed; a heating process in which the adhesive layer that is formed on the substrate or the support plate is heated; and a bonding process in which the substrate and the support plate are pressed against each other via the heated adhesive layer, thereby bonding the substrate and the support plate.

10 Claims, 3 Drawing Sheets

(51) Int. Cl.
  *B32B 37/06* (2006.01)
  *H01L 21/67* (2006.01)
  *B32B 37/04* (2006.01)
  *H05K 3/00* (2006.01)
(52) U.S. Cl.
  CPC .. *H01L 21/67092* (2013.01); *H01L 21/67132* (2013.01); *B32B 2398/20* (2013.01); *H01L 2924/0002* (2013.01); *H05K 3/0058* (2013.01)
(58) Field of Classification Search
  CPC ............... H01L 21/683; H01L 21/6835; H01L 21/67092; H01L 21/68742; B32B 37/10; B32B 37/1018; B24B 7/228; B24B 9/065
  See application file for complete search history.

(56) References Cited

U.S. PATENT DOCUMENTS

| | | | | |
|---|---|---|---|---|
| 2007/0125495 | A1* | 6/2007 | Nakamura | B32B 38/1841 156/382 |
| 2008/0200011 | A1* | 8/2008 | Pillalamarri | H01L 21/6835 438/458 |
| 2009/0218560 | A1* | 9/2009 | Flaim | H01L 21/6835 257/9 |
| 2012/0024456 | A1* | 2/2012 | Lin | H01L 21/67092 156/64 |
| 2012/0118511 | A1* | 5/2012 | Imai | B32B 38/10 156/712 |
| 2012/0132359 | A1 | 5/2012 | Nakamura et al. | |
| 2014/0057450 | A1* | 2/2014 | Bourbina | H01L 21/6835 438/759 |

FOREIGN PATENT DOCUMENTS

| | | |
|---|---|---|
| JP | 2007-158122 | 6/2007 |
| JP | 2008-182016 | 8/2008 |
| JP | 2008-251572 | 10/2008 |
| JP | 2008251572 A * | 10/2008 |
| WO | WO 2010/121068 | 10/2010 |

OTHER PUBLICATIONS

Office Action issued in Japanese application No. 2012-026708 dated May 31, 2016.

* cited by examiner

BONDING METHOD AND BONDING APPARATUS

This application is the U.S. National Phase under 35 U.S.C. § 371 of International Application No. PCT/JP2013/051340, filed Jan. 23, 2013, designating the U.S., and published in Japanese as WO 2013/118579 on Aug. 15, 2013, which claims priority to Japanese Patent Application No. 2012-026708, filed Feb. 9, 2012, the entire content of which is incorporated herein by reference.

TECHNICAL FIELD

The present invention relates to a bonding method and a bonding apparatus for bonding a substrate and a support plate via an adhesive.

BACKGROUND ART

As a technology for bonding a substrate and a support plate via an adhesive, the technology disclosed in PTL 1 is known. In PTL 1, a press working method for an inorganic substrate is disclosed, in which an assembled set of a laminated material including an inorganic substrate made of a ceramic or a semiconductor and an auxiliary material for laminate processing is disposed between the heating plates of a decompression press machine, which are heated to a predetermined temperature, and after contacting the upper and lower heating plates to the assembled set, the pressing is performed by applying a low-pressure load of at least 0.05 MPa for equal to or more than 10 seconds from the start of pressing.

CITATION LIST

Patent Literature

[PTL 1] JP-A-2002-192394 (published on Jul. 10, 2002)

SUMMARY OF INVENTION

Technical Problem

In a case where a press working method disclosed in PTL 1 in the related art is used for bonding a support plate and a substrate, as the size of the substrate increases, the an adhesive layer between the substrate and the support plate has difficulty in maintaining uniformity, and thus, it is difficult to uniformly bond the substrate and the support plate. Particularly, in the end portion of the substrate, it is difficult to uniformly bond.

The present invention is made in consideration of the above circumstance and a main object thereof is to provide a bonding method and a bonding apparatus in which the substrate and the support plate can be uniformly bonded.

Solution to Problem

In order to solve the above circumstance, a bonding method in the present invention is a method of bonding a substrate or a support plate via an adhesive. The method has a configuration to include: an adhesive layer forming process in which a thermoplastic adhesive is applied to the substrate and the support plate and an adhesive layer is formed; a heating process in which the adhesive layer that is formed on the substrate or the support plate is heated; and a bonding process in which the substrate and the support plate are pressed to each other via the heated adhesive layer, and the substrate and the support plate are bonded.

In addition, a bonding apparatus in the present invention is a bonding apparatus that bonds a substrate and a support plate via an adhesive layer. The apparatus includes: an adhesive layer forming unit for applying a thermoplastic adhesive to the substrate and the support plate and forming an adhesive layer; a heating unit for heating the adhesive layer that is formed on the substrate or the support plate; and a bonding unit for pressing the substrate and the support plate to each other via the heated adhesive layer, and bonding the substrate and the support plate.

Advantageous Effects of Invention

According to the bonding method and the bonding apparatus in the present invention, since an adhesive layer is heated before being pressed, it is possible to uniformly bond a substrate and a support plate via the adhesive layer.

DESCRIPTION OF EMBODIMENTS

Bonding Method

First Embodiment

A bonding method in the present invention is a method of bonding a substrate and a support plate via an adhesive. The method has a configuration to include: an adhesive layer forming process in which a thermoplastic adhesive is applied to the substrate or the support plate and an adhesive layer is formed; a heating process in which the adhesive layer that is formed on the substrate or the support plate is heated; and a bonding process in which the substrate and the support plate are pressed each other via the heated adhesive layer, and the substrate and the support plate are bonded.

Since a bonding apparatus 10 described below is one embodiment of means for realizing each process of the bonding method according to the present invention, in the present embodiment, for the sake of convenience, the description will be made with the bonding method in which the bonding apparatus 10 is used as an example.

(Bonding Apparatus 10)

Figure 1A:
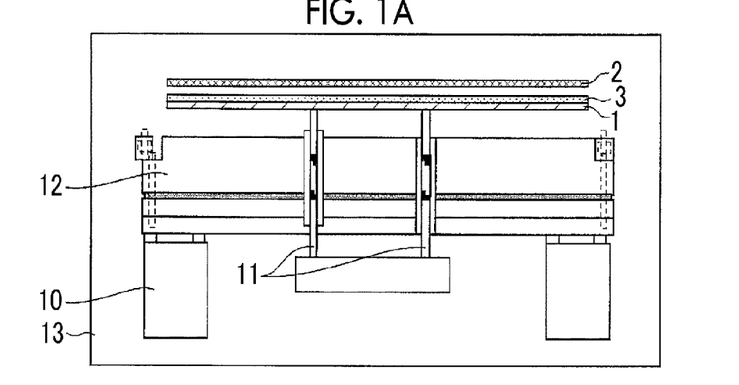
FIGS. 1A to 1C are diagrams illustrating a bonding method in a first embodiment of the present invention.
Figure 1B:
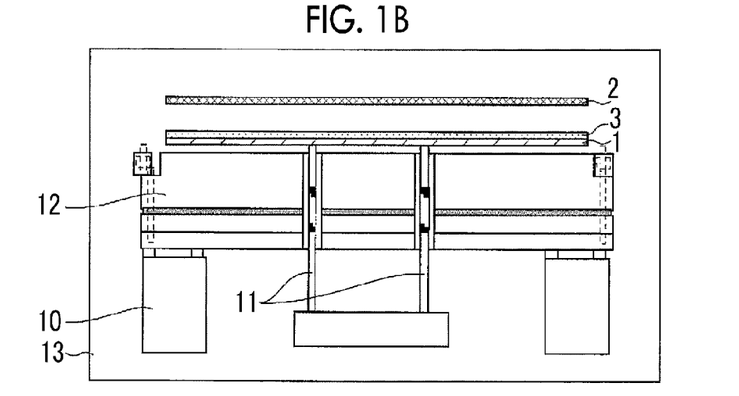
Figure 1C:
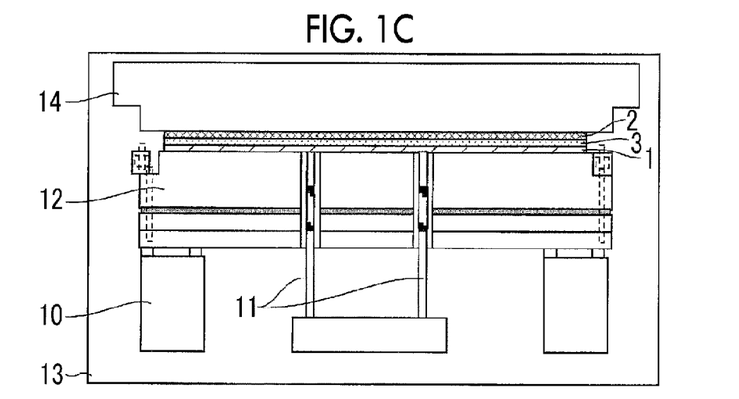

FIGS. 1A to 1C are diagrams illustrating a bonding method in the first embodiment of the present invention. As illustrated in FIGS. 1A to 1C, the bonding apparatus 10 used in the bonding method in the present embodiment includes a pin 11, a heat source (heating unit) 12, and a press (bonding unit) 14. In FIGS. 1A and 1B, the press 14 is omitted.

As illustrated in FIGS. 1A to 1C, the bonding apparatus 10 is provided in a chamber 13, and the chamber 13 is sealed and the inside thereof is in a reduced pressure environment. The thermoplastic adhesive is applied to any one of the substrate 1 and the support plate 2, and after the adhesive layer 3 is formed, then the substrate 1 and the support plate 2 which are subject to be bonded are set to the bonding apparatus 10. In the present embodiment, an example of a configuration in which the adhesive layer 3 is formed on the substrate 1 is described.

In FIGS. 1A to 1C, an adhesive layer forming unit for applying the thermoplastic adhesive to any one of the substrate 1 and the support plate 2 and forming the adhesive layer 3 is omitted. The adhesive layer forming unit may be provided on the bonding apparatus 10 or may be provided separately from the bonding apparatus 10. The forming of the adhesive layer 3 may not be performed under the reduced pressure environment, and may be performed by a configuration in which the adhesive is applied to the substrate 1 or the support plate 2 at the outside of the chamber 13, and after the adhesive layer 3 is formed, the substrate 1 and the support plate 2 which are bonded are transported into the chamber 13, and then, set to the bonding apparatus 10.

(Pin 11)

The pin 11 is in contact with the surface of the side on which the adhesive layer 3 is not formed, of the substrate 1 or the support plate 2, and supports the substrate 1 or the support plate 2. In order to reliably support the substrate 1 or the support plate 2, it is preferable to provide a plurality of pins 11, and it is preferable that the plurality of pins 11 are provided so as to be in contact with the substrate 1 or the support plate 2 at equal intervals.

In FIGS. 1A to 1C, the pin 11 is provided so as to support the area in the vicinity of the center of the substrate 1 or the support plate 2. However, the pin 11 may be provided so as to support the end portion of the substrate 1 or the support plate 2.

In the pin 11, a moving unit (not illustrated) in which the pin 11 is caused to vertically move in a state that the pin 11 supports the substrate 1 or support plate 2 is provided. By causing the pin 11 to vertically move, the distance between the substrate 1 or the support plate 2 and the heat source 12 changes. For example, it is preferable that, if the pin 11 moves down to the heat source 12 side, the surface of the side on which the adhesive layer 3 is not formed, of the substrate 1 or the support plate 2 approaches the heat source 12, and if the pin 11 moves up to a direction of being separated from the heat source 12, the surface of the side of the substrate 1 or the support plate 2 on which the adhesive layer 3 is not formed becomes far from the heat source 12. The pin 11 can either move down until the substrate 1 or the support plate 2 is in contact with the heat source 12 (pin down) or can move down until substrate 1 or the support plate 2 is not in contact with, but approaches the heat source 12 (pin up).

(Heat Source 12)

The heat source 12 heats the adhesive layer 3 by heating the substrate 1 or the support plate 2 supported by the pin 11 from the surface side of the side on which the adhesive layer 3 is not formed. In the present embodiment, the heat source 12 is provided on the surface side of the side on which the adhesive layer 3 is not formed, of the substrate 1 or the support plate 2. However, the position of the heat source 12 is not limited thereto.

It is preferable that the size of the heat source 12 is substantially the same as those of the substrate 1 and the support plate 2 or has a surface larger than those of the substrate 1 and the support plate 2, but it is not particularly limited thereto as long as the heat source 12 can heat the adhesive layer 3 when the pin 11 moves to the lower side and the substrate 1 or the support plate 2 approaches the heat source 12. As an example of the heat source 12, a warm water heater, a warm air heater, an infrared heater, an electric heater, a film heater, and the like can be included.

(Press 14)

The press 14 causes the substrate 1 and the support plate 2 to press to each other, and bonds the substrate 1 and the support plate 2 via the adhesive layer 3. In the present embodiment, the heat source 12 is provided on the surface side of the side on which the adhesive layer 3 is not formed, of the substrate 1 on which the adhesive layer 3 is formed. Therefore, the substrate 1 and the support plate 2 may be caused to press each other by pressing the substrate 1 and the support plate 2 against the heat source 12.

In addition, the substrate 1 and the support plate 2 are installed between two presses 14, and the substrate 1 and the support plate 2 may be caused to press each other by the substrate 1 and the support plate 2 being interposed between the two presses 14. It is preferable that the size of the press 14 is substantially the same as those of the substrate 1 and the support plate 2 or has a surface larger than those of the substrate 1 and the support plate 2.

(Chamber 13)

The chamber 13 accommodates the bonding apparatus 10 therein and seals the bonding apparatus 10, and the inside thereof becomes to be in the reduced pressure environment by a suction unit (not illustrated) or the like. The chamber 13 enables the substrate 1 and the support plate 2 to be bonded in a state that the bonding apparatus 10 is accommodated therein and is in a reduced pressure environment.

(Substrate 1)

The substrate 1 is bonded to the support plate 2 via the adhesive layer 3. Then, the substrate 1 is subject to a thinning and mounting process in a state of being supported by the support plate 2. The substrate 1 is not limited to the wafer substrate, and any of a ceramic substrate, a thin film substrate, a flexible substrate, or the like can be used.

(Support Plate 2)

The support plate 2 is supporting body that supports the substrate 1, and is bonded to the substrate 1 via the adhesive layer 3. For this reason, the support plate 2 needs to have strength sufficient for preventing the damage or the deformation of the substrate 1 during the process of thinning, transporting, and mounting of the substrate 1. From the above point of view, the support plate 2 such as those made of glass, silicon, or acrylic resin can be used.

(Adhesive Layer 3)

The adhesive layer 3 bonds the substrate 1 and the support plate 2, and is formed by applying an adhesive to the substrate 1 or the support plate 2 (adhesive layer forming process). A method of applying the adhesive to the substrate 1 or the support plate 2 is not particularly limited, but for example, a spin coating, a dipping roller blade, spray coating, or a slit coating can be used.

The adhesive that forms the adhesive layer 3 is not particularly limited, as long as it is a thermoplastic adhesive material of which the thermal fluidity increases by heating. As the thermoplastic adhesive material, for example, acrylic resin, styrene-based resin, maleimide-based resin, hydrocarbon resin, or elastomer can be used.

The thickness of the adhesive layer 3 can be appropriately set depending on the type of substrate 1 and the support plate 2 which are subject to be bonded, the process performed to the substrate 1 after the adhering, or the like. However, it is preferable to be 5 to 200 µm, and is further preferable to be 10 to 150 µm.

Between the substrate 1 and the support plate 2, another layer other than the adhesive layer 3 may be formed. For example, between the support plate 2 and the adhesive layer 3, a release layer altered by irradiation with light may be formed. By forming the release layer, it is possible to easily separate the substrate 1 and the support plate 2 by irradiating with light after the thinning, transportation, and mounting of the substrate 1.

In a case where the release layer is not formed, by supplying solvent to the adhesive layer 3 and dissolving the adhesive layer 3, it is possible to separate the substrate 1 and the support plate 2. At this time, if a through-hole that passes through the support plate 2 in a thickness direction is formed, it is possible to easily supply the solvent to the adhesive layer 3 via the through-hole. Therefore, it is preferable to form the through-hole.

In the bonding method in the present embodiment, firstly, as illustrated in FIG. 1A, the substrate 1 on which the adhesive layer 3 is formed is placed on the pin 11 of the bonding apparatus 10 in the chamber 13, and the support plate 2 is installed at the position facing the adhesive layer 3. At this time, the inside of the chamber 13 becomes to be in the reduced pressure environment. In FIGS. 1A and 1B, a supporting member that supports the support plate 2 is not illustrated.

Next, as illustrated in FIG. 1B, by causing the pin 11 that supports the substrate 1 to move down to the heat source 12 side, the substrate 1 approaches the heat source 12. Then, the substrate 1 is heated by the heat source 12 (heating process). That is, the substrate 1 and the adhesive layer 3 are heated under the reduced pressure environment. At this time, the substrate 1 may approach but may not be in contact with the heat source 12 (pin up), and causing the pin 11 to further move down, the substrate 1 may be in contact with the heat source 12 (pin down).

By causing the substrate 1 to be in contact with the heat source 12, it is possible to heat the substrate 1 to a desired temperature with the short time, and the adhesive layer 3 is quickly heated to the desired temperature. Therefore, it is preferable to cause the substrate 1 to be in contact with the heat source 12.

By heating the substrate 1 by causing the substrate 1 to approach or to be in contact with the heat source 12, the substrate 1 and the adhesive layer 3 are efficiently heated. Here, it is preferable that the substrate 1 is heated until the temperature of the adhesive layer 3 reaches glass transition temperature or more, and it is further preferable to be heated until the temperature of the adhesive layer 3 reaches the temperature higher than glass transition temperature by 10° C. or more. By heating the adhesive layer 3 up to the temperature equal to or higher than the glass transition temperature, the thermal fluidity of the adhesive layer 3 is improved and is easily deformed.

A condition for heating the substrate 1 by the heat source 12 varies depending on the type of the adhesive that forms the adhesive layer 3, the distance between the heat source 12 and the substrate 1, or the like. However, for example, it is preferable to heat the substrate 1 for five seconds to five minutes at the temperature of 40° C. to 250° C.

Next, as illustrated in FIG. 1C, the press 14 moves down in a direction to the support plate 2 from the surface side of the back direction to the side facing the adhesive layer 3 of the support plate 2, and after the being in contact with the support plate 2, further moves down together with the support plate 2 in such a manner that the support plate 2 is in contact with the adhesive layer 3. Then, the press 14 further moves down so as to press the substrate 1 and the support plate 2 against the heat source 12, and the substrate 1 and the support plate 2 press each other between the press 14 and the heat source 12 (bonding process). In this way, the substrate 1 and the support plate 2 are bonded. At this time, since the inside of the chamber 13 is in the reduced pressure environment, it is possible to suitably bond the substrate 1 and the support plate 2 without the air bubbles being mixed in between the adhesive layer 3 and the support plate 2.

A pressing condition when pressing the substrate 1 and the support plate 2 varies depending on the type of the adhesive that forms the adhesive layer 3 or the like. However, it is preferable to press the substrate 1 and the support plate 2 for 0.5 to ten minutes at the pressure of 50 kg to 15,000 kg, or further preferably 100 kg to 10,000 kg.

In FIG. 1C, even when the substrate 1 and the support plate 2 are bonded by causing the substrate 1 and the support plate 2 to press each other, it is preferable to press each other with heating the substrate 1 and the support plate 2 by the heat source 12. By pressing the substrate 1 and the support plate 2 with heating the substrate 1 and the support plate 2, the thermal fluidity of the adhesive layer 3 can be maintained and the adhesive layer 3 can easily be deformed according to the pressure. A pressing condition when pressing the substrate 1 and the support plate 2 with heating the substrate 1 and the support plate 2 varies depending on the type of adhesive that forms the adhesive layer 3. However, it is preferable to press the substrate 1 and the support plate 2 for 0.5 minute to 10 minutes at the pressure of 50 kg to 15,000 kg, or further preferably 100 kg to 10,000 kg with heating the substrate 1 and the support plate 2 at 60° C. to 300° C., or further preferably 100° C. to 250° C.

In this way, before bonding the substrate 1 and the support plate 2, the substrate 1 on which the adhesive layer 3 is formed is heated in advance (preheating). Therefore, the thermal fluidity of the adhesive layer 3 is improved, and the adhesive layer 3 between the substrate 1 and the support plate 2 is uniformly spread by the pressing. Therefore, it is possible to uniformly bond the substrate 1 and the support plate 2, and a bonding failure never occurs.

In addition, since the thermal fluidity of the adhesive layer 3 is improved due to the preheating, the adhesive layer 3 is easily deformed by the pressing and it is possible to shorten the time for bonding the substrate 1 and the support plate 2.

Furthermore, after heating the adhesive layer 3 in advance, since the substrate 1 and the support plate 2 press each other, compared to the bonding method in the related art in which the substrate 1 and the support plate 2 are heated while being pressed, the thermal fluidity of the adhesive layer 3 comes to be in more suitable state, and it is possible to more uniformly bond the substrate 1 and the support plate 2.

Second Embodiment

The second embodiment of the present invention will be described with reference to FIGS. 2A to 2D. FIGS. 2A to 2D are diagrams illustrating a bonding method in the second embodiment of the present invention. The present embodiment is different from the first embodiment in a point that the adhesive layer 3 formed between the substrate 1 and the support plate 2 is heated at atmospheric pressure environment. In the present embodiment, the point which is different from that in the first embodiment will be described in detail, and the point similar to that in the first embodiment will not be described in detail. In addition, members similar to those described in the first embodiment will be referenced by the same reference numbers and the detail description thereof will be omitted.

Figure 2A:
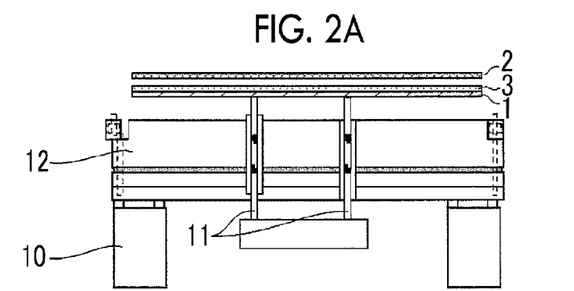
FIGS. 2A to 2D are diagrams illustrating a bonding method in another embodiment of the present invention.

In the bonding method in the present embodiment, first, as illustrated in FIG. 2A, the support plate 2 is installed in such a manner that the support plate 2 supports the substrate 1 on which the adhesive layer 3 is formed by the pin 11 of the bonding apparatus 10 under the atmospheric pressure environment and is facing the adhesive layer 3. In the present embodiment, the example of a case where the adhesive layer 3 is formed on the substrate 1 will be described.

Figure 2B:
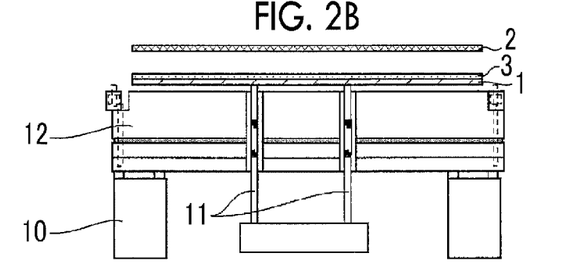

Next, as illustrated in FIG. 2B, by causing the pin 11 supporting the substrate 1 to move down to the heat source 12, the substrate 1 approaches the heat source 12. Then, the substrate 1 on which the adhesive layer 3 is formed is heated (preheating). That is, the substrate 1 and the adhesive layer 3 are heated at the atmospheric pressure environment.

It is preferable that the substrate 1 is heated until the temperature of the adhesive layer 3 reaches glass transition temperature or more, and it is further preferable to be heated until the temperature of the adhesive layer 3 reaches the temperature higher than glass transition temperature by 10° C. or more. The condition for heating the substrate 1 varies depending on the type of adhesive that forms the adhesive layer 3. However, it is preferable to heat for five seconds to five minutes at the temperature of 40° C. to 250° C.

Figure 2C:
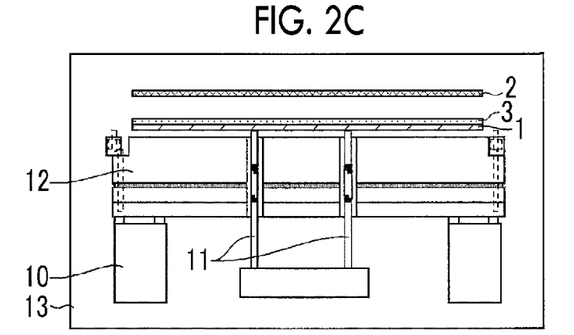

Next, as illustrated in FIG. 2C, the bonding apparatus 10 is installed in the chamber 13 together with the substrate 1 on which the adhesive layer 3 is formed and the support plate 2, and the chamber 13 is sealed for the decompression.

Figure 2D:
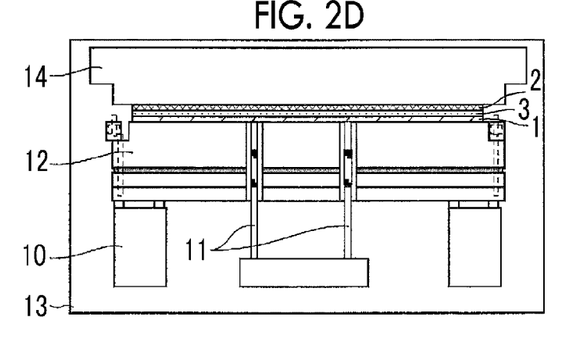

Then, as illustrated in FIG. 2D, the press 14 moves down in a direction to the support plate 2 from the surface side of the back direction to the side facing the adhesive layer 3 of the support plate 2, and after the being in contact with the support plate 2, further moves down together with the support plate 2 in such a manner that the support plate 2 is in contact with the adhesive layer 3. Then, the press 14 further moves down so as to press the substrate 1 and the support plate 2 against the heat source 12, and the substrate 1 and the support plate 2 press each other between the press 14 and the heat source 12. Then, the pressing of the substrate 1 and the support plate 2 is performed under the reduced pressure environment.

In the present embodiment, since the preheating is performed on the substrate 1 under the atmospheric pressure environment, it is possible to increase the temperature of the substrate 1 in a shorter time compared to the case of performing the preheating on the substrate 1 under the reduced pressure environment. For this reason, in a case where the substrate 1 is heated under the atmospheric pressure environment at the same temperature as that in the case where the preheating is performed under the reduced pressure environment, it is possible to heat the adhesive layer 3 up to the temperature equal to or higher than the glass transition temperature within a shorter time. As a result thereof, it is possible to bond the substrate 1 and the support plate 2 within the shorter time.

[Bonding Apparatus]

The bonding apparatus according to the present invention is a bonding apparatus that bonds a substrate and a support plate via an adhesive layer, and includes: an adhesive layer forming unit for applying a thermoplastic adhesive to the substrate or the support plate and forming an adhesive layer; a heating unit for heating the adhesive layer that is formed on the substrate or the support plate; and a bonding unit for pressing the substrate and the support plate each other via the heated adhesive layer, and bonding the substrate and the support plate.

An embodiment of a bonding apparatus according to the present invention is the bonding apparatus 10 used in the bonding method according to the present invention described above, and the description of the bonding apparatus according to the present invention is in accordance with the description of the bonding method according to the present invention.

The embodiments of the present invention will be described in further detail by examples shown below. Of course, the present invention is not limited to the examples shown below, it is needless to say that various modifications can be made for details. Furthermore, the present invention is not limited to the embodiments described above, various modifications can be made with the scope in the Claims, and the embodiment which can be obtained by appropriately combining the technological means respectively disclosed also can be included in the technological range of the present invention. In addition, all documents listed herein are incorporated as the reference.

EXAMPLES

Example 1

An adhesive layer having a thickness of 50 μm was formed by applying adhesive (product name: "TZNR(Registered Trademark)-A3007t", made by Tokyo Ohka Kogyo Co., Ltd.) on a wafer substrate, and baking at the temperature of 100° C., 160° C., and 220° C. for three minutes respectively.

Next, the wafer substrate on which the adhesive layer has been formed and a support plate (a glass substrate) were set to the bonding apparatus 10 in the chamber 13. Then, the inside of the chamber 13 was decompressed (vacuum degree 10 Pa). The pin 11 that supports the wafer substrate on which the adhesive layer has been formed was caused to move down until the pin 11 is in contact with the heat source 12 (pin down). In addition, the support plate was disposed so as to face the adhesive layer.

Next, the wafer substrate on which the adhesive layer has been formed was heated for one minute in a state that the reduced pressure environment in the chamber 13 is maintained, and thus, the temperature of the wafer substrate increased up to 107° C.

Then, the wafer substrate and the support plate were bonded via the adhesive layer by causing the wafer substrate on which the adhesive layer has been formed and the support plate to press each other for one minute under the condition of the bonding temperature 215° C. and the bonding pressure 1000 Kg.

Example 2

An adhesive layer having a thickness of 50 μm was formed by applying adhesive (product name: "TZNR(Registered Trademark)-A3007t", made by Tokyo Ohka Kogyo Co., Ltd.) on a wafer substrate, and baking at the temperature of 100° C., 160° C., and 220° C. for three minutes respectively.

Next, the wafer substrate on which the adhesive layer has been formed and a support plate were set to the bonding apparatus 10 in the chamber 13, and the inside of the chamber 13 was decompressed (vacuum degree 10 Pa). Then, the pin 11 that supports the wafer substrate on which the adhesive layer has been formed was caused to move down until the pin 11 approaches the heat source 12 (pin up). The wafer substrate is not in contact with the heat source 12. In addition, the support plate was disposed so as to face the adhesive layer.

Next, the wafer substrate on which the adhesive layer has been formed was heated for two minutes in a state that the reduced pressure environment in the chamber 13 is maintained, and thus, the temperature of the wafer substrate increased up to 88° C.

Then, the wafer substrate and the support plate were bonded via the adhesive layer by causing the wafer substrate on which the adhesive layer has been formed and the support plate to press each other for two minutes under the condition of the bonding temperature 215° C. and the bonding pressure 1000 Kg.

Example 3

An adhesive layer having a thickness of 60 μm was formed by applying adhesive (product name: "TZNR(Registered Trademark)-A3007", made by Tokyo Ohka Kogyo Co., Ltd.) on a wafer substrate.

Next, the wafer substrate on which the adhesive layer has been formed and a support plate were set to the bonding apparatus 10 under the atmospheric pressure environment. Then, the pin 11 that supports the wafer substrate on which the adhesive layer has been formed was caused to move down until the pin 11 is in contact with the heat source (pin down). In addition, the support plate was disposed so as to face the adhesive layer.

Next, the wafer substrate on which the adhesive layer has been formed was heated for 40 seconds in a state where the bonding apparatus 10 is under the atmospheric pressure environment, and thus, the temperature of the wafer substrate increased up to 205° C.

Then, the bonding apparatus 10 was accommodated in the chamber 13 together with the wafer substrate and the support plate, and then, the inside of the chamber 13 was decompressed. In a state where the reduced pressure environment (vacuum degree 10 Pa) in the chamber 13 is maintained, the wafer substrate and the support plate were bonded via the adhesive layer by causing the wafer substrate on which the adhesive layer has been formed and the support plate to press each other for one minute under the condition of the bonding temperature 205° C. and the bonding pressure 800 Kg.

Comparative Example

An adhesive layer having a thickness of 50 μm was formed by applying adhesive (product name: "TZNR(Registered Trademark)-A3007", made by Tokyo Ohka Kogyo Co., Ltd.) on a wafer substrate, and baking at the temperature of 100° C., 160° C., and 220° C. for three minutes respectively.

Next, without performing the preheating on the wafer substrate on which the adhesive layer has been formed, the wafer substrate and the support plate were bonded via the adhesive layer by causing the wafer substrate on which the adhesive layer has been formed and the support plate to press each other for two minutes under the condition of the bonding temperature 215° C. and the bonding pressure 1000 Kg.

With respect to the above-described Examples 1 to 3 and Comparative Example, the bonding state of the wafer substrate and the support plate was checked. Table 1 illustrates the result.

TABLE 1

|  | Example 1 | Example 2 | Example 3 | Comparative Example |
|---|---|---|---|---|
| Preheating | Preheating done (reduced pressure environment) | Preheating done (reduced pressure environment) | Preheating done (atmospheric environment) | No preheating |
| Heating time(s) (pin up) | 0 | 120 | 0 | 0 |
| Heating time(s) (pin down) | 60 | 0 | 40 | 0 |
| Bonding time (s) | 60 | 120 | 60 | 120 |
| Total processing time (s) | 120 | 240 | 100 | 120 |
| TTV | 2.09 | 2.63 | 2.41 | 2.45 |
| Bonding failure | OK | OK | OK | NG |

In Table 1, TTV (total thickness variation) indicates the accuracy of the bonding, and means the difference between the maximum value and the minimum value of the thickness of the entire laminate in a case where the thickness of the laminate is measured in a thickness direction with the back surface of the bonded wafer substrate as a reference, with regard to a laminate created by bonding the wafer substrate and the support plate via the adhesive layer.

For this reason, in a case where the TTV is large, it indicates that the thickness of the adhesive layer is not uniform and the bonding accuracy is low, and in a case where the TTV is small, it indicates that the thickness of the adhesive layer is uniform and the bonding accuracy is high. From the viewpoint of the uniformity in the adhesive layer, it is desirable that the TTV is equal to or less than three. In all of Examples 1 to 3, the adhesive layer was uniformly formed.

In Table 1, a bonding failure (delamination) indicates whether the failure in bonding of the wafer substrate and the support plate exists or not. Since a space was generated between the adhesive layer and the support plate, such a bonding failure that the wafer substrate and the support plate are not sufficiently bonded was visually checked. Regarding Examples 1 to 3, the bonding failure did not occur (OK), but regarding Comparative Example, the bonding failure occurred (NG).

In addition, comparing Example 1 and Comparative Example, both of the total processing times were the same 120 seconds. Furthermore, comparing Example 2 and the Comparative Example, the total processing time in Example 2 was shorter than that in the Comparative Example. That is, in any case of under the reduced pressure environment or under the atmospheric pressure environment, by performing the preheating on the wafer substrate on which the adhesive layer has been formed, it was possible to bond the wafer substrate and the support plate in time equal to or shorter than total processing time in a case where the preheating is not performed, without a bonding failure occurring.

Figure 3:
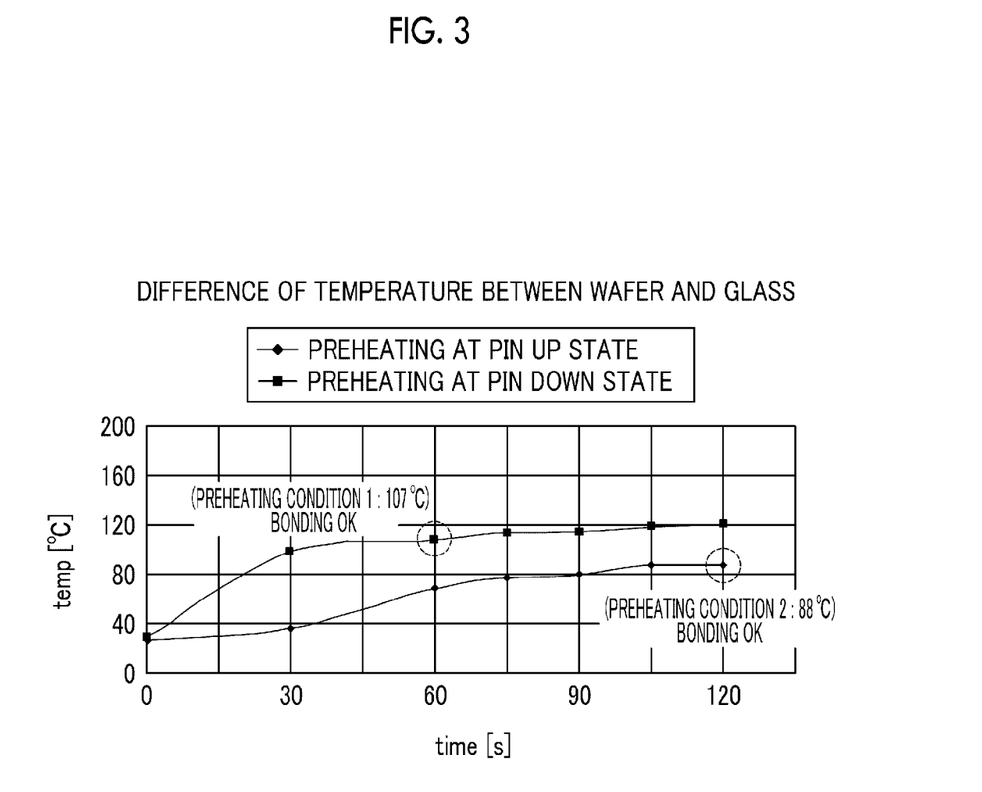
FIG. 3 is a graph illustrating a relationship between a heating time of a wafer surface and a temperature.

Here, the relationship between the heating time and the temperature of the wafer substrate surface is illustrated in FIG. 3. FIG. 3 is a graph indicating the relationship between the heating time and the temperature in cases of the preheating at the pin upstate (preheating condition 2) and the preheating at the pin down state (preheating condition 1), under the reduced pressure environment. From the graph, it can be read that the increasing rate of the temperature on the wafer substrate in a case of the preheating at the pin down state is higher than that in a case of the preheating at the pin up state. Then, as described in Examples 1 and 2, uniform bonding was possible in a shorter time in a case of the preheating at the pin down state than in a case of the preheating at the pin up state.

INDUSTRIAL APPLICABILITY

The present invention, for example, can be widely used in the process of manufacturing a miniaturized semiconductor apparatus.

REFERENCE SIGNS LIST

1. substrate
2. support plate
3. adhesive layer
10. bonding apparatus
11. pin
12. heat source (heating unit)
13. chamber
14. press (bonding unit)

What is claimed is:

1. A method of bonding a substrate and a support plate via an adhesive, comprising:
  applying a thermoplastic adhesive to a part selected from the group consisting of the substrate and the support plate to form an adhesive layer;
  supporting the part to which the adhesive is applied on pins separated from and above a heat source;
  stacking the part to which the adhesive is not applied separated from and above the part to which the adhesive is applied;
  lowering the pins supporting the part to which the adhesive is applied so as to move the part to which the adhesive is applied toward the heat source, thereby pre-heating the adhesive layer from the side of the part to which the adhesive is applied on which the adhesive layer is not formed;
  maintaining the adhesive layer at a temperature equal to or higher than a glass transition temperature of the adhesive layer; and
  pressing, by use of the heat source and a press, the substrate and the support plate against each other via the pre-heated adhesive layer to bond the substrate and the support plate.

2. The bonding method according to claim 1, wherein the adhesive layer is heated under an atmospheric pressure environment.

3. The bonding method according to claim 1, wherein the adhesive layer is heated under a reduced pressure environment.

4. The bonding method according to claim 1, wherein the substrate and the support plate are bonded under a reduced pressure environment.

5. The bonding method according to claim 1, wherein the substrate and the support plate are pressed while being heated.

6. The bonding method according to claim 2, wherein the substrate and the support plate are bonded under a reduced pressure environment.

7. The bonding method according to claim 3, wherein the substrate and the support plate are bonded under a reduced pressure environment.

8. The bonding method according to claim 4, wherein the substrate and the support plate are pressed while being heated.

9. The bonding method according to claim 6, wherein the substrate and the support plate are pressed while being heated.

10. The bonding method according to claim 7, wherein the substrate and the support plate are pressed while being heated.

* * * * *